United States Patent
Foo et al.

(10) Patent No.: US 12,125,768 B2
(45) Date of Patent: Oct. 22, 2024

(54) FACE-TO-FACE THROUGH-SILICON VIA MULTI-CHIP SEMICONDUCTOR APPARATUS WITH REDISTRIBUTION LAYER PACKAGING AND METHODS OF ASSEMBLING SAME

(71) Applicant: Altera Corporation, San Jose, CA (US)

(72) Inventors: Loke Yip Foo, Bayan Baru (MY); Choong Kooi Chee, Penang (MY)

(73) Assignee: Altera Corporation, San Jose, CA (US)

( * ) Notice: Subject to any disclaimer, the term of this patent is extended or adjusted under 35 U.S.C. 154(b) by 47 days.

(21) Appl. No.: 17/461,459

(22) Filed: Aug. 30, 2021

(65) Prior Publication Data

US 2021/0391238 A1 Dec. 16, 2021

Related U.S. Application Data

(62) Division of application No. 16/284,239, filed on Feb. 25, 2019, now Pat. No. 11,107,751.

(30) Foreign Application Priority Data

Mar. 27, 2018 (MY) .......................... PI 2018701247

(51) Int. Cl.
*H01L 23/48* (2006.01)
*H01L 21/56* (2006.01)
(Continued)

(52) U.S. Cl.
CPC .......... *H01L 23/481* (2013.01); *H01L 21/561* (2013.01); *H01L 21/565* (2013.01);
(Continued)

(58) Field of Classification Search
CPC ............... H01L 23/481; H01L 23/3128; H01L 23/3672; H01L 23/5386; H01L 21/551;
(Continued)

(56) References Cited

U.S. PATENT DOCUMENTS 9,000,490 B2 4/2015 Vo et al.
9,297,971 B2 * 3/2016 Thacker .............. H01L 25/0652
(Continued)

OTHER PUBLICATIONS

"U.S. Appl. No. 16/284,239, Advisory Action mailed Mar. 10, 2021", 2 pgs.
(Continued)

*Primary Examiner* — Dao H Nguyen
(74) *Attorney, Agent, or Firm* — Schwabe, Williamson & Wyatt, P.C.

(57) ABSTRACT

Reduced-profile semiconductor device apparatus are achieved by thinning a semiconductive device substrate at a backside surface to expose a through-silicon via pillar, forming a recess to further expose the through-silicon via pillar, and by seating an electrical bump in the recess to contact both the through-silicon via pillar and the recess. In an embodiment, the electrical bump contacts a semiconductor package substrate to form a low-profile semiconductor device apparatus. In an embodiment, the electrical bump contacts a subsequent die to form a low-profile semiconductor device apparatus.

14 Claims, 8 Drawing Sheets

(51) Int. Cl.
*H01L 23/00* (2006.01)
*H01L 23/31* (2006.01)
*H01L 23/367* (2006.01)
*H01L 23/538* (2006.01)
*H01L 25/18* (2023.01)

(52) U.S. Cl.
CPC ...... *H01L 23/3128* (2013.01); *H01L 23/3672* (2013.01); *H01L 23/5383* (2013.01); *H01L 23/5386* (2013.01); *H01L 24/09* (2013.01); *H01L 24/17* (2013.01); *H01L 24/33* (2013.01); *H01L 24/73* (2013.01); *H01L 24/97* (2013.01); *H01L 25/18* (2013.01); *H01L 2224/0231* (2013.01); *H01L 2224/02373* (2013.01); *H01L 2224/02379* (2013.01); *H01L 2224/02381* (2013.01); *H01L 2224/73204* (2013.01); *H01L 2924/15311* (2013.01)

(58) Field of Classification Search
CPC ....... H01L 21/565; H01L 24/09; H01L 24/17; H01L 24/33; H01L 24/73; H01L 24/97; H01L 24/14; H01L 25/18; H01L 25/0655; H01L 2224/0231; H01L 2224/02373; H01L 2224/02381; H01L 2224/73204; H01L 2924/15311
See application file for complete search history.

(56) References Cited

U.S. PATENT DOCUMENTS

| | | | | |
|---|---|---|---|---|
| 2008/0157358 A1* | 7/2008 | Yang | ........................ | H01L 24/24 257/737 |
| 2010/0109169 A1* | 5/2010 | Kolan | .................. | H01L 25/0655 257/E23.116 |
| 2012/0049339 A1* | 3/2012 | Wang | ................ | H01L 23/49827 257/E23.101 |
| 2012/0175341 A1* | 7/2012 | Lake | ................. | H01L 21/76831 156/60 |
| 2013/0056865 A1* | 3/2013 | Lin | ........................ | H01L 21/568 257/737 |
| 2013/0217188 A1* | 8/2013 | Wang | .................... | H01L 23/433 438/118 |
| 2014/0001639 A1* | 1/2014 | Hiraishi | .................. | H01L 23/48 257/773 |
| 2014/0134804 A1* | 5/2014 | Kelly | ................ | H01L 21/76251 438/118 |
| 2014/0264235 A1* | 9/2014 | Gong | .................. | H01L 23/5383 257/421 |
| 2015/0255429 A1 | 9/2015 | Katkar et al. | | |
| 2015/0303120 A1* | 10/2015 | Zhang | ................ | H01L 23/49827 257/738 |
| 2019/0304876 A1 | 10/2019 | Foo et al. | | |
| 2020/0402926 A1* | 12/2020 | Huang | ................ | H01L 23/3675 |

OTHER PUBLICATIONS

"U.S. Appl. No. 16/284,239, Final Office Action mailed Nov. 18, 2020", 23 pgs.
"U.S. Appl. No. 16/284,239, Non Final Office Action mailed Jun. 11, 2020", 18 pgs.
"U.S. Appl. No. 16/284,239, Notice of Allowance mailed Apr. 28, 2021", 5 pgs.
"U.S. Appl. No. 16/284,239, Preliminary Amendment filed Mar. 31, 2015", 9 pgs.
"U.S. Appl. No. 16/284,239, Response filed Feb. 18, 2021 to Final Office Action mailed Nov. 18, 2020", 10 pgs.
"U.S. Appl. No. 16/284,239, Response filed Mar. 30, 2020 to Restriction Requirement mailed Jan. 30, 2020", 11 pgs.
"U.S. Appl. No. 16/284,239, Response filed Sep. 11, 2020 to Non Final Office Action mailed Jun. 11, 2020", 11 pgs.
"U.S. Appl. No. 16/284,239, Restriction Requirement mailed Jan. 30, 2020", 7 pgs.
Office Action from U.S. Appl. No. 18/089,207, mailed Dec. 19, 2023, 17 pgs.

* cited by examiner

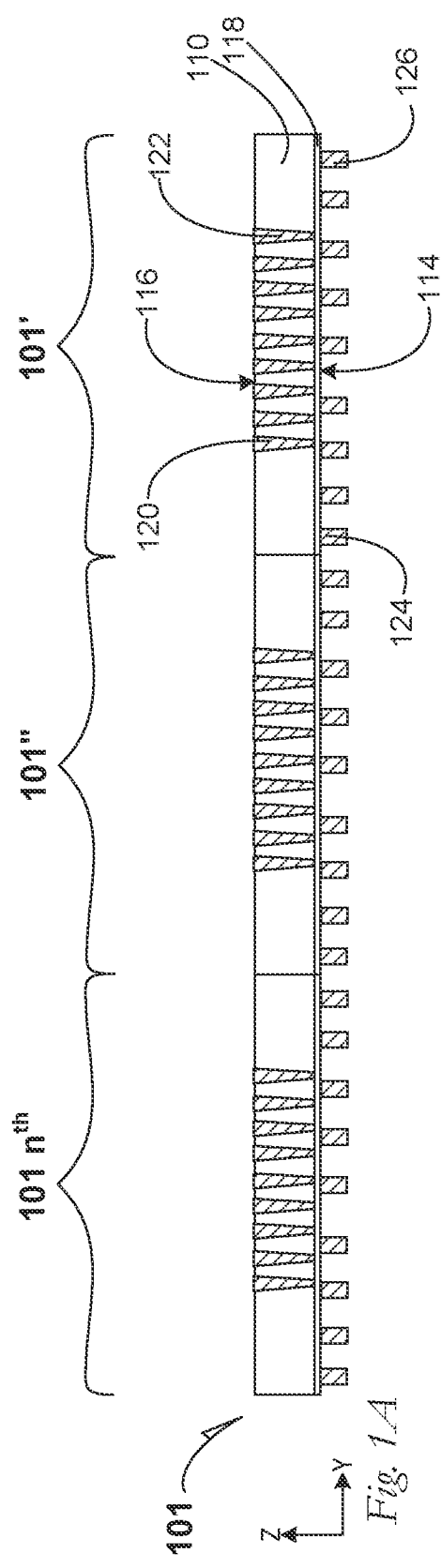
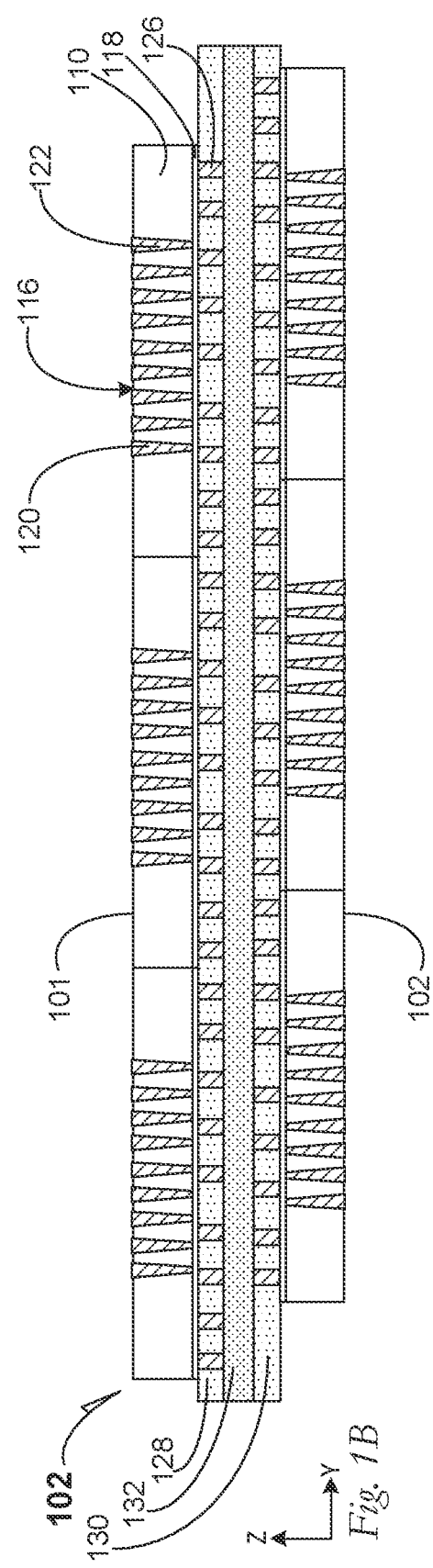

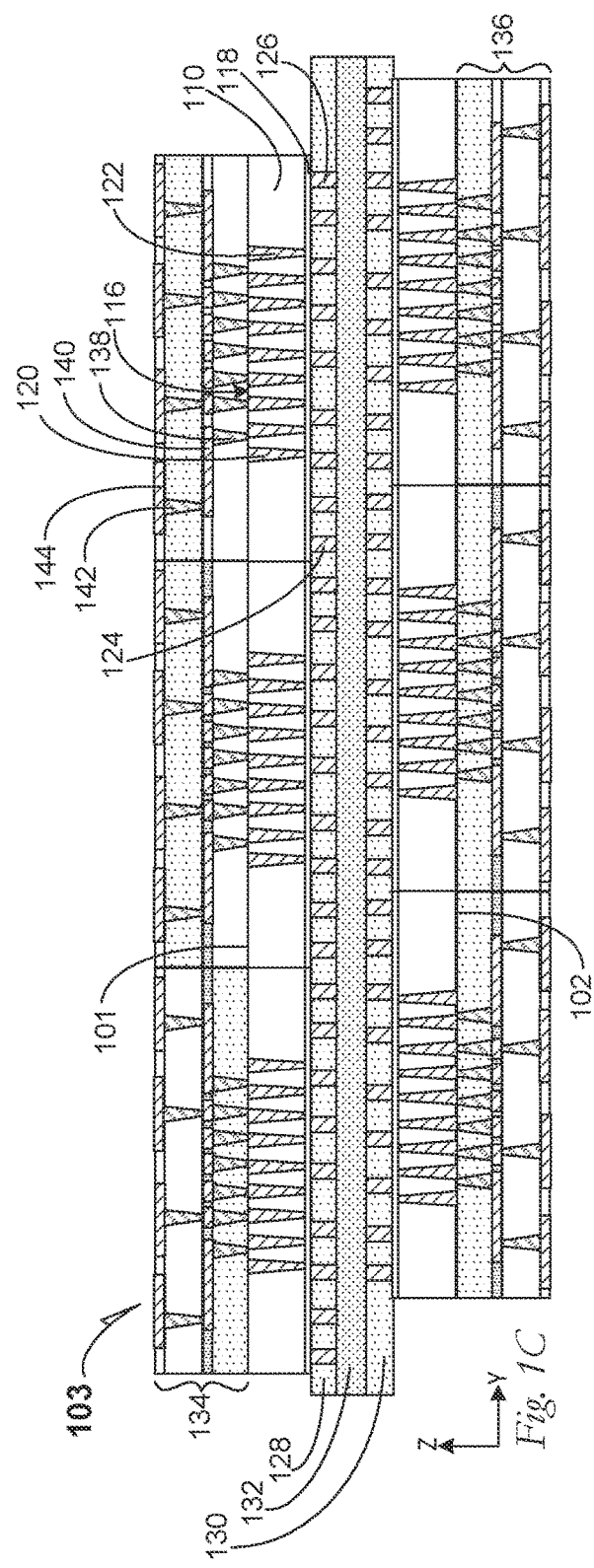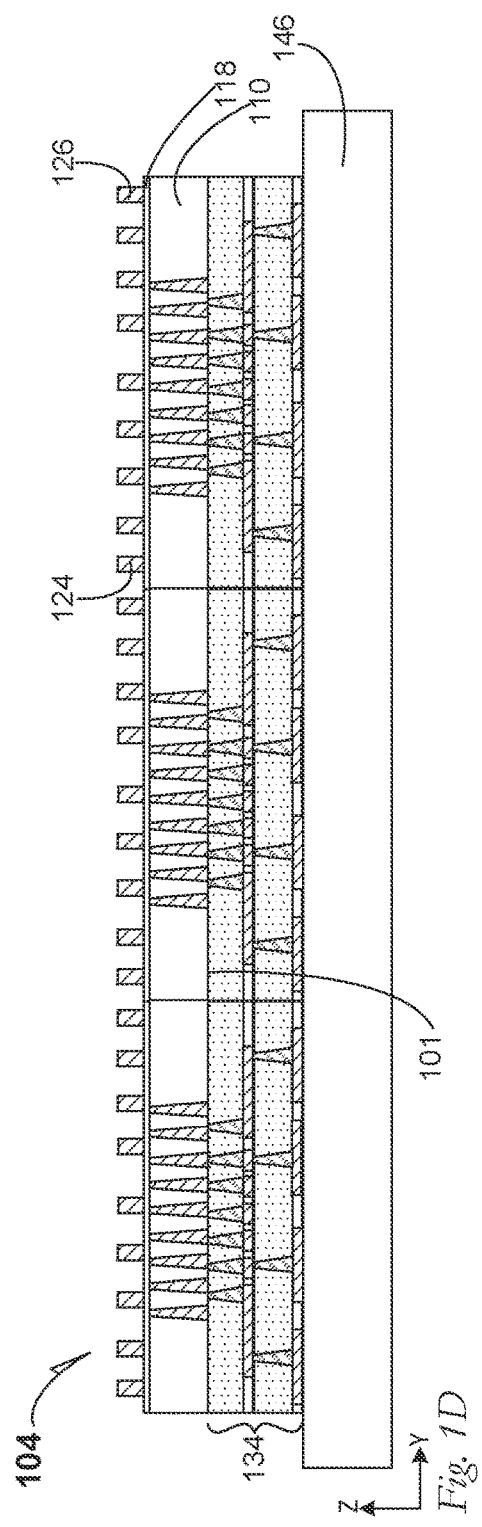

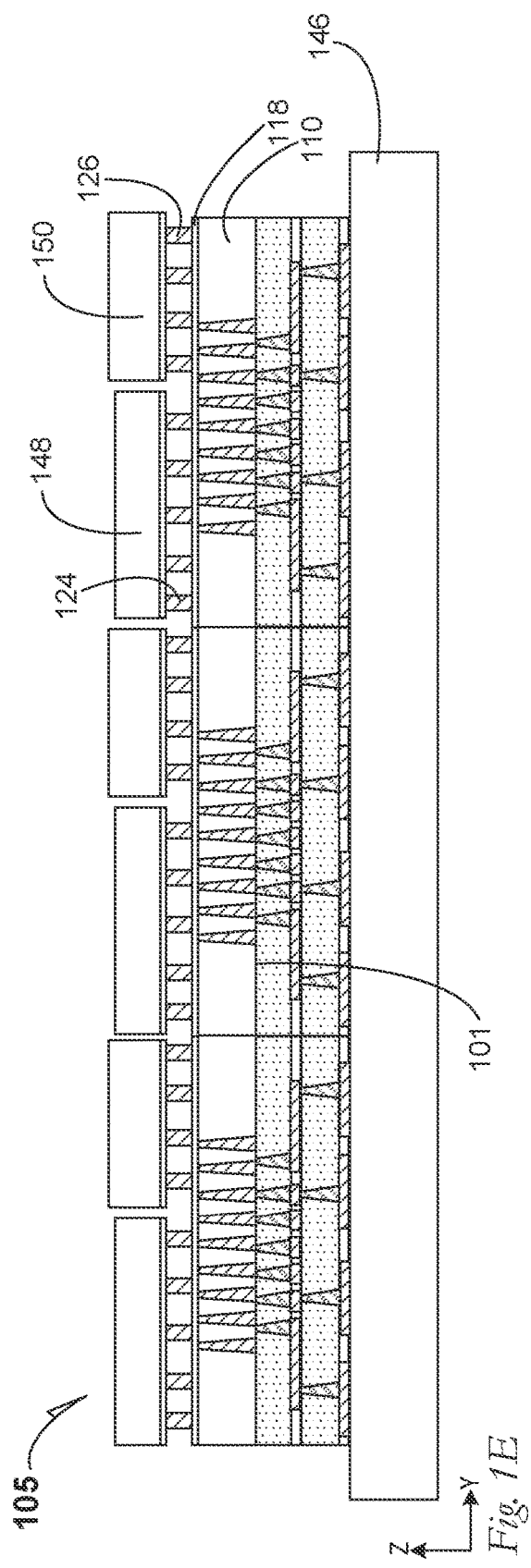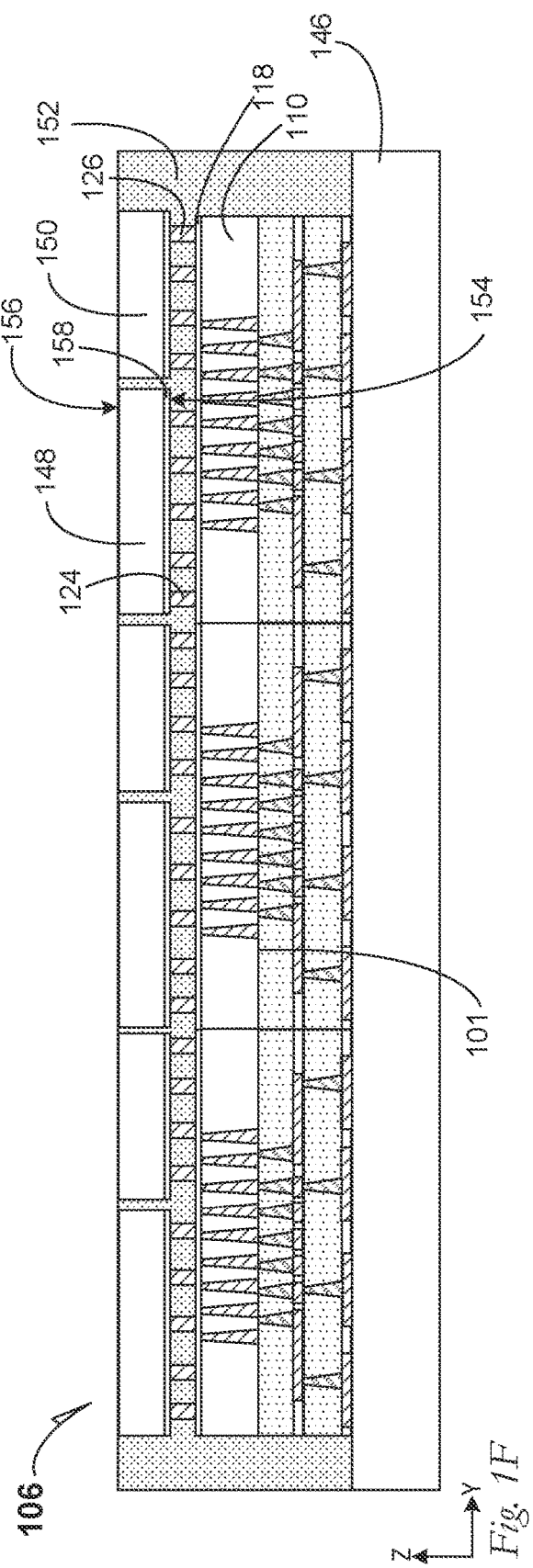

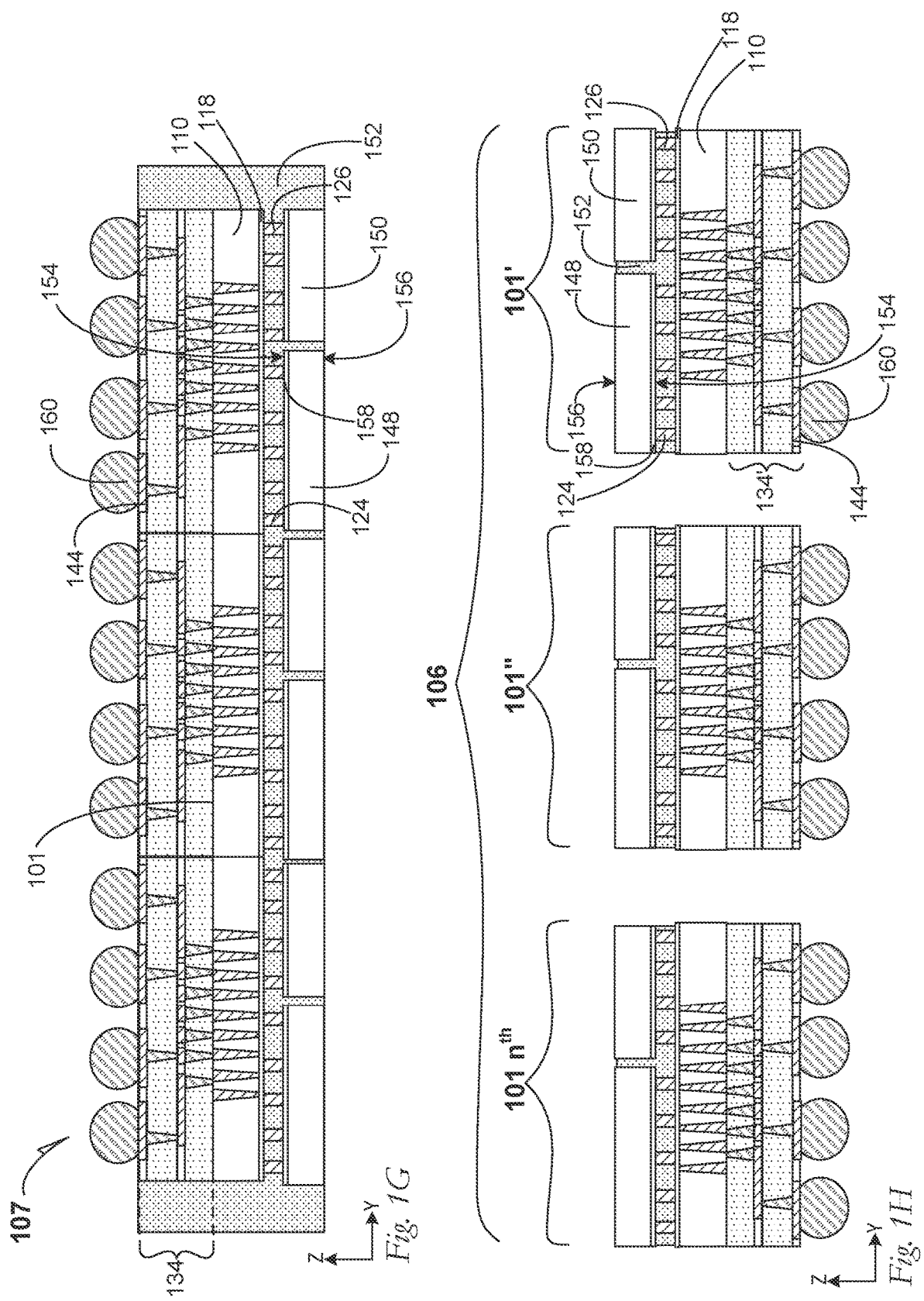

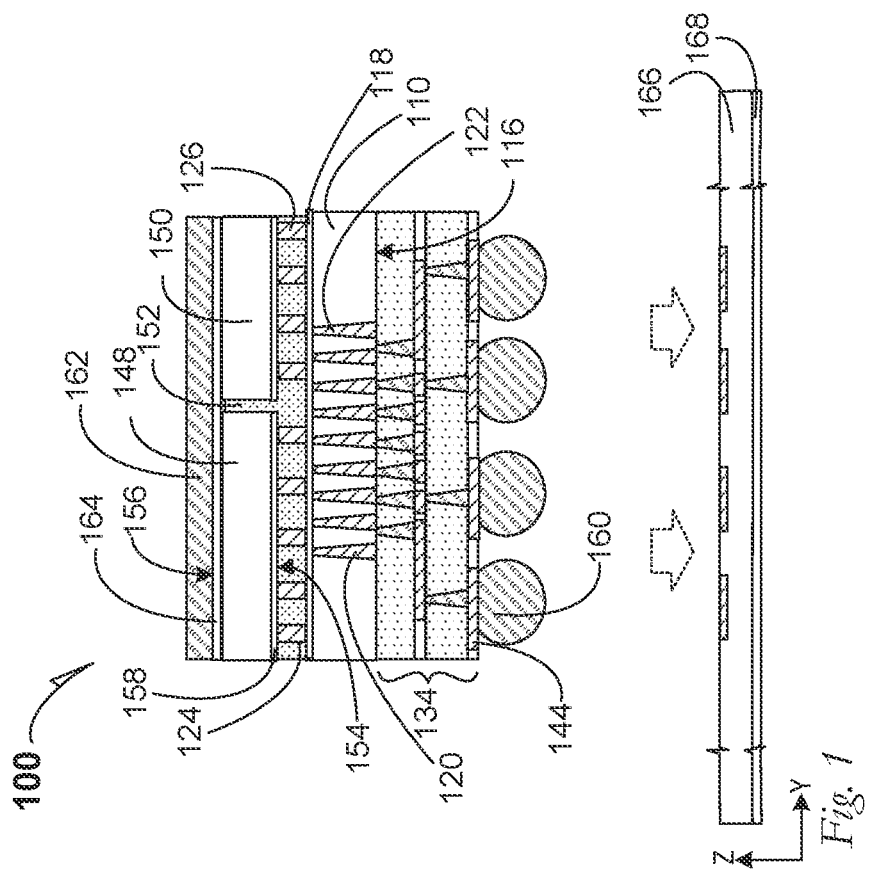

FACE-TO-FACE THROUGH-SILICON VIA MULTI-CHIP SEMICONDUCTOR APPARATUS WITH REDISTRIBUTION LAYER PACKAGING AND METHODS OF ASSEMBLING SAME

PRIORITY APPLICATION

This application is a divisional of U.S. application Ser. No. 16/284,239, filed Feb. 25, 2019, which claims the benefit of priority to Malaysian Application Serial Number PI 2018701247, filed Mar. 27, 2018, all which are incorporated herein by reference in their entirety.

FIELD

This disclosure relates to through-silicon via techniques with face-to-face multiple die computing apparatus that use redistribution layers for packaging substrates.

BACKGROUND

Semiconductive device miniaturization during packaging requires 2D multiple-die footprints.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1A is a cross-section elevation of a semiconductive wafer during processing according to an embodiment;

FIG. 1B is a cross-section elevation of the semiconductive wafer depicted in FIG. 1A after further processing according to an embodiment;

FIG. 1C is a cross-section elevation of the semiconductor wafer composite package depicted in FIG. 1B after further processing according to an embodiment;

FIG. 1D is a cross-section elevation of a portion of the semiconductor wafer composite package depicted in FIG. 1C after further processing according to an embodiment;

FIG. 1E is a cross-section elevation of the first wafer and its corresponding wafer-level redistribution layer after further processing according to an embodiment;

FIG. 1F is a cross-section elevation of the first wafer, the corresponding redistribution layer, and bonded daughter dice after further processing according to an embodiment;

FIG. 1G is a cross-section elevation of the semiconductor wafer composite package depicted in FIG. 1F after further processing according to an embodiment;

FIG. 1H is a cross-section elevation of the semiconductor wafer composite package depicted in FIG. 1G after package singulation according to an embodiment;

FIG. 1 is a cross-section elevation of one face-to-face, through-silicon via, multi-die apparatus that has been assembled into a chip package that approaches the footprint of the first semiconductive device after further processing of structures depicted in FIG. 1H according to an embodiment;

DETAILED DESCRIPTION

Figure 2:
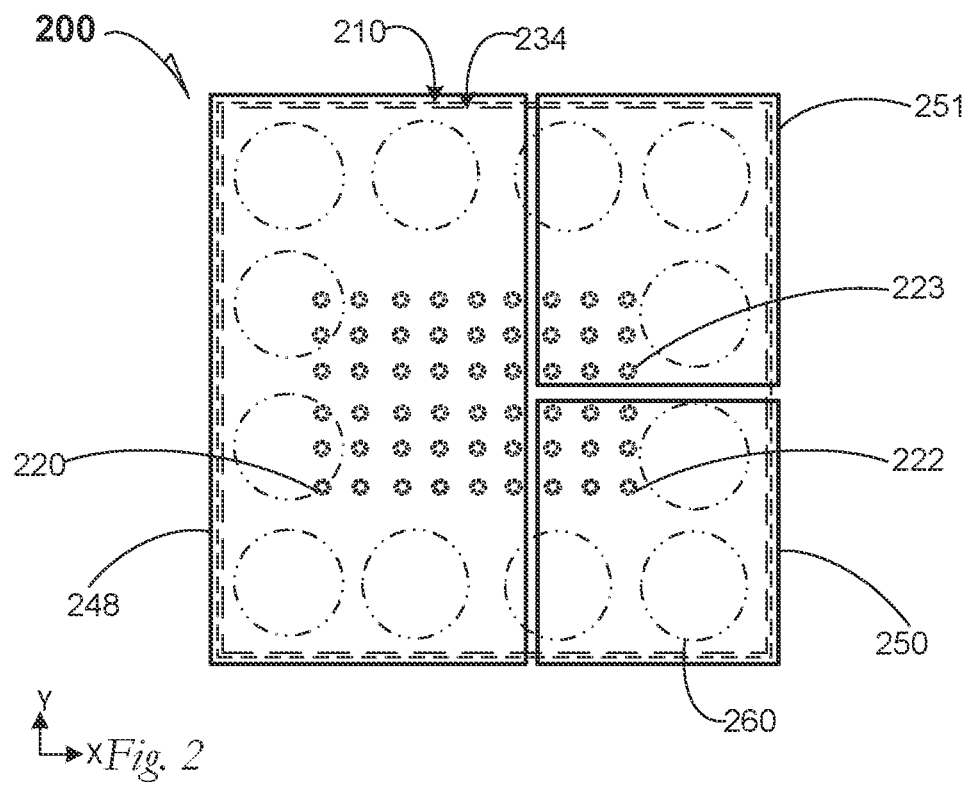
FIG. 2 is a top plan of a subsequent die, a second die and a third die, all of which are face-to-face mounted on a first die according to an embodiment.

Face-to-face (F2F), through-silicon via (TSV) multi-die apparatus are assembled into a chip-scale package (CSP) that approaches the footprint of a first semiconductive device. Several TSVs allow all inter-chip interconnections to be within the first die footprint. In an embodiment, such packages are achieved without necessarily conforming to industry-norm CSPs. Chip proximity by the F2F architecture, allows for higher-speed signal transmission. Heat management is carried out by a single heat sink that forms a heat-enabling solution for the F2F TSV chip package.

FIG. 1A is a cross-section elevation of a semiconductive wafer 101 during processing according to an embodiment. A semiconductive wafer 101 includes several individual die sectors, including a first die sector 101', a subsequent die sector 101 $n^{th}$, and a second die sector 101". It is understood that several individual dice may be processed from a single wafer according to the several disclosed embodiments, but three individual dice are illustrated as exemplars.

Processing is directed to the first die sector 101'. The first die sector 101' is referred to as the first semiconductive device 110. The first semiconductive device 110 includes an active surface 114 and a backside surface 116. The active surface 114 includes active devices and metallization 118 (hereinafter metallization 118). In an embodiment, a first through-silicon via (TSV) 120 and a second TSV 122 are part of several TSVs that communicate from the backside surface 116 to the metallization 118. In an embodiment, a first electrical bump 124 is coupled to the metallization 118, as well as a second electrical bump 126 is coupled to the metallization 118. In an embodiment, the electrical bumps 124 and 126 are solder bumps. In an embodiment, the electrical bumps 124 and 126 are copper pillars.

FIG. 1B is a cross-section elevation of the semiconductive wafer 101 depicted in FIG. 1A after further processing according to an embodiment. A semiconductive wafer composite package includes the semiconductor wafer 101 depicted in FIG. 1A, as well as a semiconductor wafer 102 that is identical to the semiconductor wafer 101. The two wafers 101 and 102 are assembled face-to-face with respective adhesives 128 and 130, which are bonded to a medium such as polymer media 132 that acts as a carrier.

FIG. 1C is a cross-section elevation of the semiconductor wafer composite package depicted in FIG. 1B after further processing according to an embodiment. The two semiconductor wafers 101 and 102 have each been assembled to respective redistribution layers 134 and 136.

Attention is directed to the first die 110. The redistribution layer (RDL) 134, includes but is not limited to a two-layer fan-out distribution architecture. In an embodiment, the RDL 134 includes an inner via 138 that contacts the first die 100, a first trace level 140 that contacts the inner via. Opposite the inner via 138 and first trace are an outer via 142 and an RDL bond pad 144. It is understood that the RDL 134 may have a three-layer fan-out, or fan-in architecture. Similarly, the RDL 134 may have a four-layer architecture, but a two-layer, fan-out architecture is illustrated.

As illustrated, each die in each wafer 101 and 102 is processed and fitted with an RDL at wafer-level processing. The adhesives 128 and 130 and the carrier 132 hold the wafers 101 and 102 sufficiently rigidly to allow processing the respective RDLs 134 and 136. In an embodiment, the respective RDLs 134 and 136 are separately processed and are picked-and-placed onto wafers 101 and 102.

FIG. 1D is a cross-section elevation of a portion of the semiconductor wafer composite package depicted in FIG. 1B after further processing according to an embodiment. The first wafer 101 has been released from the carrier 132 and the adhesive 128. The first wafer 101 and the corresponding RDL 134 have been inverted and seated upon a carrier 146. In an embodiment, the first die 110 (and all dice within the first wafer 101) are tested by use of the RDL 134, which allows for bin splitting for each die within the first wafer 101 as well as each accompanying to-be-singulated RDL of the RDL 134. In an embodiment, testing is done before separating the first wafer 101 and the second wafer 102 from the adhesives 128 and 130 and the polymer media 132.

In an embodiment after testing, a flux is applied to the first and subsequent electrical bumps 124 and 126 in preparation for bonding various types of daughter dice to the first die 110.

FIG. 1E is a cross-section elevation of the first wafer 101 and its corresponding wafer-level RDL 134 after further processing according to an embodiment. The first die 110 has been further processed by bonding a subsequent die 148 to the first electrical bump 124, and the first die has also been further processed by bonding a second die 150 to the second electrical bump 126.

FIG. 1F is a cross-section elevation of the first wafer 101, the corresponding RDL, and bonded daughter dice 148 and 150 after further processing according to an embodiment. After bonding of the subsequent die 148 and the second die 150, a wafer-level molding compound 152 is formed over the first wafer 101 and the several daughter dice 148 and 150.

In an embodiment, the wafer-level molding compound 152 underfills the respective subsequent and second dice 148 and 150, such that the respective first and second electrical bumps 124 and 126 are also contacted with the wafer-level molding compound 152.

Attention is directed to the subsequent die 148, which includes an active surface 154 and a backside surface 156. The active surface 154 includes active devices and metallization 158 (hereinafter metallization 158). Similar to the subsequent die 148, the second die 150 is similarly oriented and has active and backside surfaces and metallization.

The subsequent die 148 and the second die 150 are each mounted F2F with the first die 110 and the subsequent and second dice 148 and 150 each electrically contacts the first die 110 through the respective first and second electrical bumps 124 and 126.

In an embodiment, processing of the wafer-level molding compound 152 is done by backgrinding to expose the subsequent die backside surface 156 (as well as the second die backside surface).

In an embodiment, the subsequent die 148 and the second die 150 do not have the same approximate thicknesses. In example embodiment as illustrated in FIG. 1E, the subsequent die 148 has a lower Z-height than the second die 150. In this example embodiment, backgrinding is done to achieve substantially the same backside height from the first die 110 metallization 118 for the respective subsequent and second dice 148 and 150. As illustrated, both the wafer-level molding compound 152 and the respective subsequent and second dice 148 and 150 have substantially the same Z-height, as used within conventional backgrinding parameters.

FIG. 1G is a cross-section elevation of the semiconductor wafer composite package depicted in FIG. 1F after further processing according to an embodiment. The first die 110 has been inverted and a ball-grid array 160 (one landside electrical bump 160 enumerated) has been assembled to the several RDL bond pads 144 (one RDL bond pad 144 enumerated).

FIG. 1H is a cross-section elevation of the semiconductor wafer composite package 105 depicted in FIG. 1O after package singulation according to an embodiment. The several die sectors 101', 101" and 101 $n^{th}$ are singulated and the exemplary first die 110 contains the first die sector 101'. In an embodiment, singulation is done by a sawing technique to singulate the several die sectors 101', 101" and 101 $n^{th}$ while protecting the several structures of the RDL 134', the subsequent and second dice 148 and 150, respectively.

FIG. 1 is a cross-section elevation of one F2F, TSV, multi-die apparatus 100 that has been assembled into a chip-scale package (CSP) that approaches the footprint of the first semiconductive device 110 after further processing of structures depicted in FIG. 1H according to an embodiment. In an embodiment, the F2F, TSV, multi-de apparatus 100 has the relative dimensions as illustrated, but it is not necessarily within industry-norm relative dimensions of chip-scale packaging.

In an embodiment, a heat sink 162 is seated upon the backside surface 156 of the subsequent die 148 (as well as the backside surface of the second die 150) by use of a thermal adhesive 164.

As illustrated the first TSV 120 and the second TSV 122 are part of several TSVs that communicate from the backside surface 116 to the metallization 118. In an embodiment as illustrated, the several TSVs are grouped into a region of higher TSV density (illustrated along the X-direction), where the subsequent die 148 and the second die 150 approximately abut. In an embodiment, the several TSVs are uniformly dispersed throughout the first die 110.

In an embodiment, the first die 110 is a processor such as made by Intel Corporation of Santa Clara, California, the subsequent die 148 is a memory die, and the second die 150 is a memory-controller hub (MCH). In an embodiment, the first die 150 is a platform-controller hub (PCH), the subsequent die 148 is a processor and the second die 150 is a memory die. In an embodiment, the first die 150 is an MCH, the subsequent die 148 is a processor and the second die 150 is a baseband processor. In an embodiment, the first die 150 is both a PCH and an MCH, the subsequent die 148 is a processor and the second die 150 is a memory die.

As illustrated, the first semiconductive device 110 has an X-Y footprint (where the Y-direction is into and out of the plane of the drawing) and the X-Y footprint may be referred to as a die shadow. At singulation, the die shadow is the largest X-Y footprint that is derived from any singulated semiconductive device 110, although the RDL 134 may have substantially the same X-Y dimensions as the die shadow, within conventional parameters of wafer-level RDL singulation techniques such as the effects of a die and RDL sawing procedure. Similarly, the subsequent and second semiconductive devices 148 and 150 are within the die shadow. Similarly, the several landside electrical bumps 160 are also confined within the die shadow.

Whereas the first semiconductive device 110 is central to the F2F, TSV, chip package, multi-die apparatus 100, the "die shadow" is cast in both directions along the Z-direction.

In a system embodiment, the F2F, TSV, chip package, multi-die apparatus 100, is assembled to a board 166 such as a motherboard in a computing system. In an embodiment, the board 166 includes a shell 168 that provides at least one of physical and electrical-insulation protection to the F2F, TSV, chip package, multi-die apparatus 100. In an embodiment, the shell 168 is the outer shell of a hand-held computing system such as a wireless communicator.

FIG. 2 is a top plan of a subsequent die 248, a second die 250 and a third die 251, all of which are F2F mounted on a first die 210 according to an embodiment. The first die 210 is illustrated in ghosted lines to represent being positioned directly below (Z-direction) the several dice 248, 250 and 251, similarly to the subsequent die 148 and second die 150 being positioned directly below the first die 110 depicted in FIG. 1. The first die 210 is represented slightly smaller than the composite footprint of the several dice 248, 250 and 251 to illustrate perspective. In an embodiment, an RDL 234 is disposed below the first die 210. The RDL 234 is also represented slightly smaller than the footprint of the first die 210 to illustrate perspective.

In an embodiment, a ball-grid array 260 (one landside electrical bump 260 enumerated) has been mated to the RDL 234, similarly to the ball-grid array 160 mated to the RDL 134 illustrated in FIG. 1. The ball-grid array 260 is also depicted in ghosted lines to represent position below several other structures.

In an embodiment, TSV communication between the first die 210 and the respective subsequent, second and third dice 248, 250 and 251, is done with several TSVs. A first TSV 220 couples the first die 210 to the subsequent die 248. A second TSV 222 couples the first die 210 to the second die 250. A third TSV 223 couples the first die 210 to the third die 251.

In an embodiment, the respective first, second and third TSV 220, 222 and 223 are part of several TSVs that are clustered in the first die 210 below the intersection of the respective subsequent, second and third dice 248, 250 and 251. In an embodiment, the clustering as illustrated may be described as having a higher TSV density at an intersection between two dice that are F2F with the first die 210, than at an edge of the first die 210. In an embodiment, the clustering as illustrated may be described as having a higher TSV density at an intersection between three dice that are F2F with the first die 210, than at an edge of the first die 210. This asymmetrical clustering embodiment is depicted in FIG. 2.

Similarly to the die shadow embodiments disclosed with respect to the semiconductor apparatus 100 depicted in FIG. 1, a die shadow for the first semiconductive device 210 substantially covers all other structures depicted in FIG. 2.

Figure 3:
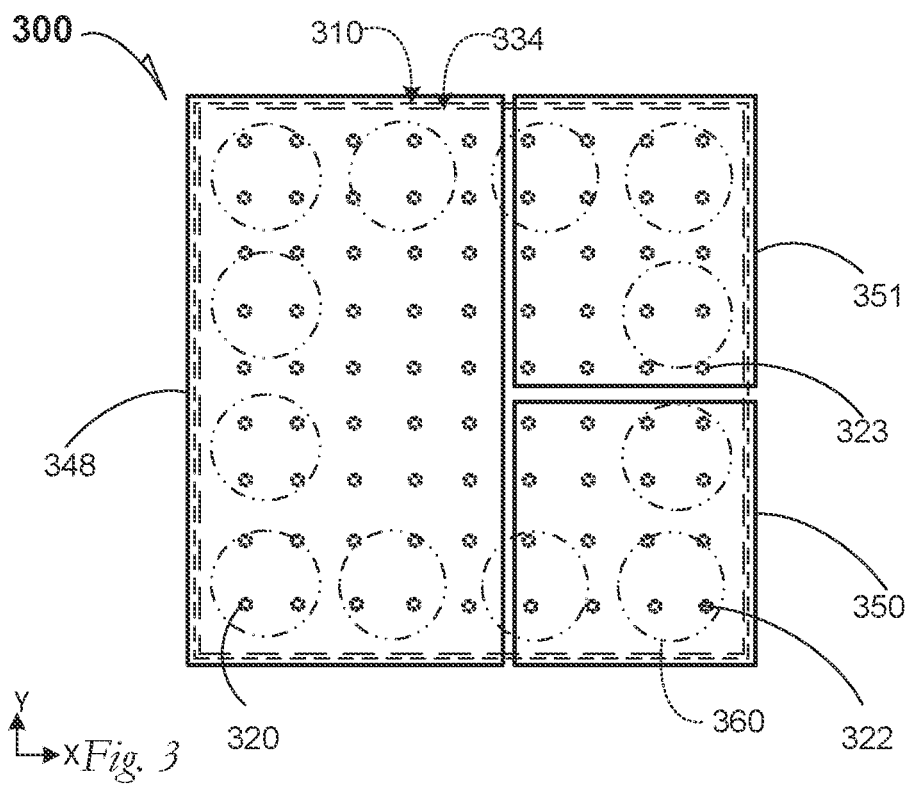
FIG. 3 is a top plan of a subsequent die, a second die and a third die, all of which are face-to-face mounted on a first die according to an embodiment.

FIG. 3 is a top plan of a subsequent die 348, a second die 350 and a third die 351, all of which are F2F mounted on a first die 310 according to an embodiment. The first die 310 is illustrated in ghosted lines to represent being positioned directly below (Z-direction) the several dice 348, 350 and 351, similarly to the subsequent die 248 and second die 250 being positioned directly below the first die 210 depicted in FIG. 2. The first die 310 is represented slightly smaller than the composite footprint of the several dice 348, 350 and 351 to illustrate perspective. In an embodiment, an RDL 334 is disposed below the first die 310. The RDL 334 is also represented slightly smaller than the footprint of the first die 310 to illustrate perspective.

In an embodiment, a ball-grid array 360 (one landside electrical bump 360 enumerated) has been mated to the RDL 334, similarly to the ball-grid array 260 mated to the RDL 234 illustrated in FIG. 2. The ball-grid array 360 is also depicted in ghosted lines to represent position below several other structures.

In an embodiment, TSV communication between the first die 310 and the respective subsequent, second and third dice 348, 350 and 351, is done with several TSVs. A first TSV 320 couples the first die 310 to the subsequent die 348. A second TSV 322 couples the first die 310 to the second die 350. A third TSV 323 couples the first die 310 to the third die 351.

In an embodiment, the respective first, second and third TSV 320, 322 and 323 are part of several TSVs that are substantially uniformly distributed across the first die 310 below the respective subsequent, second and third dice 348, 350 and 351. In an embodiment, the substantially uniform distribution as illustrated may be described as having the same TSV density at an intersection between two dice that are F2F with the first die 310, compared to any grouping of four or more TSV at an edge of the first die 310. This clustering embodiment is depicted in FIG. 3. In an embodiment, TSV density per unit area below any of the dice that are F2F with the first die, is the same as density per unit area below any other of the dice.

Similarly to the die shadow embodiments disclosed with respect to the semiconductor apparatus 100 depicted in FIG. 1, a die shadow for the first semiconductive device 310 substantially covers all other structures depicted in FIG. 3.

Figure 4:
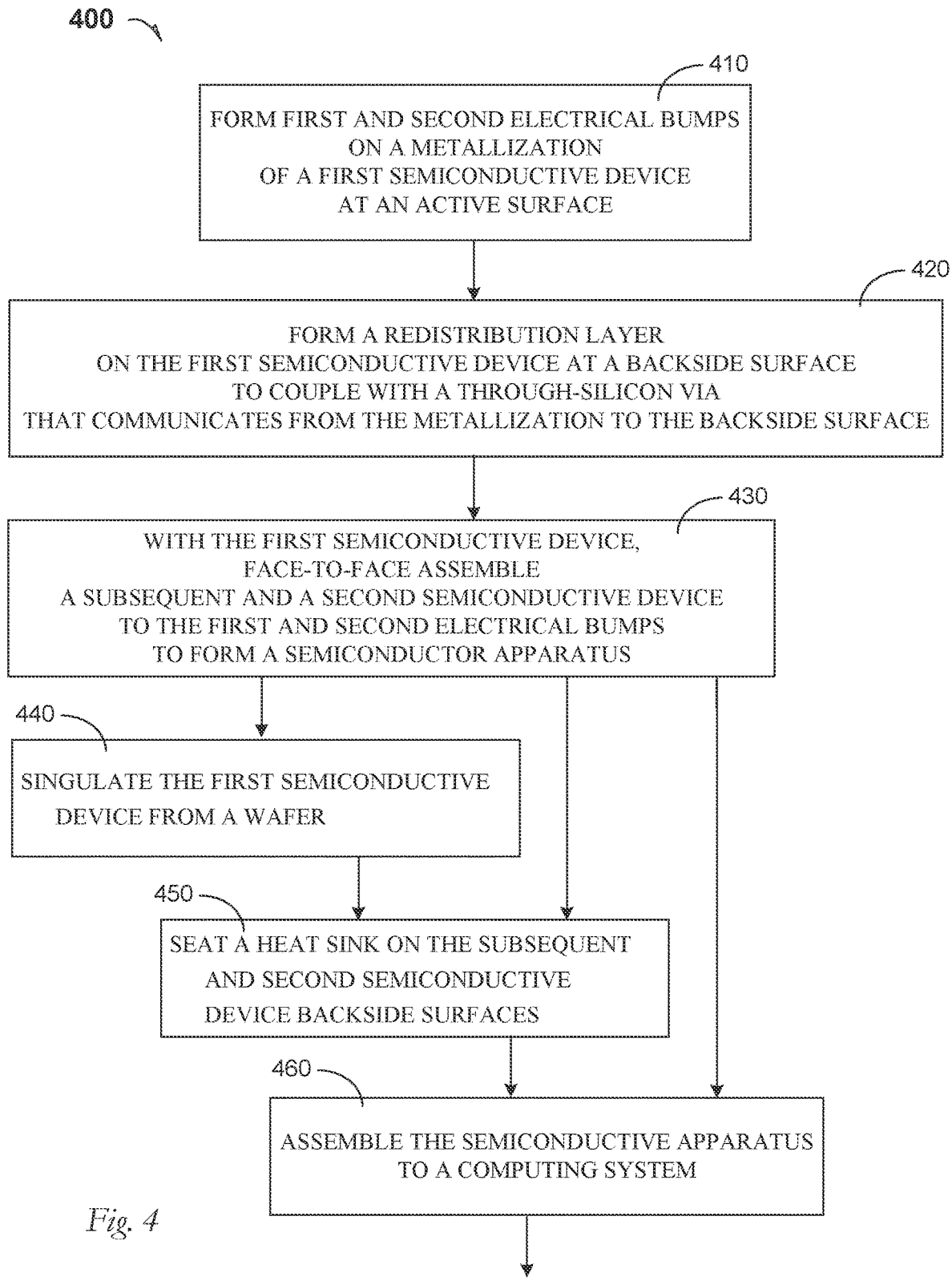
FIG. 4 is a process flow diagram according to several embodiments.

FIG. 4 is a process flow diagram according to several embodiments.

At 410, the process includes forming first and second electrical bumps on a metallization of a first semiconductive device at an active surface.

At 420, the method includes forming a redistribution layer on the first semiconductive device at a backside surface to couple with a through-silicon via that communicates from the metallization to the backside surface.

At 430, the process includes face-to-face assembling subsequent and second semiconductive devices with the first semiconductive device to the respective first and second electrical bumps.

At 440, the process includes singulating the first semiconductive device from a wafer.

At 450, the process includes seating a heat sink on the subsequent and second semiconductive device backside surfaces.

At 460, the process includes assembling the semiconductor apparatus to a computing system.

Figure 5:
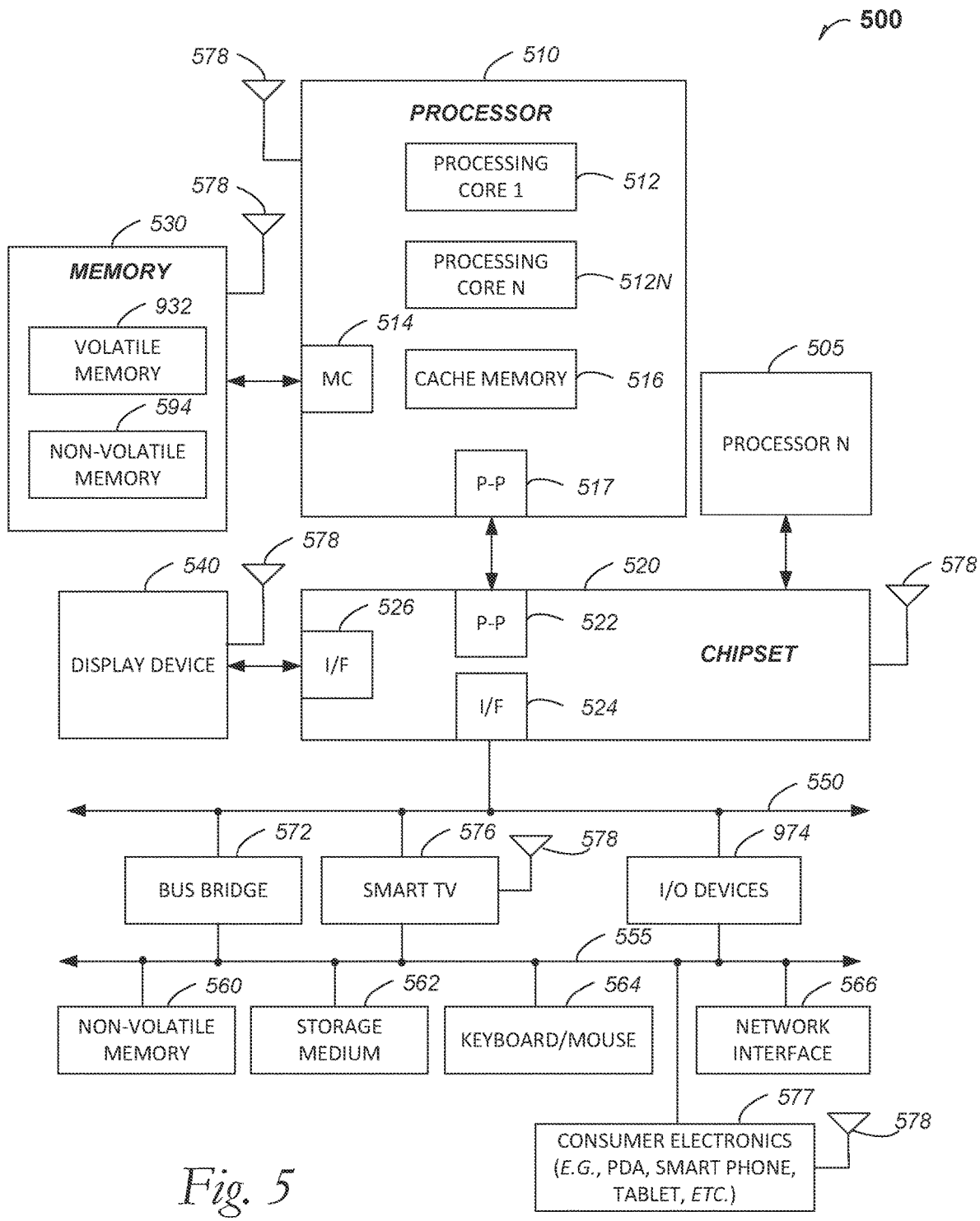
FIG. 5 is included to show an example of a higher-level device application for the disclosed embodiments.

FIG. 5 is included to show an example of a higher-level device application for the disclosed embodiments. The F2F, TSV, chip package, multi-die apparatus embodiments may be found in several parts of a computing system. In an embodiment, the F2F, TSV, chip package, multi-die apparatus embodiments can be part of a communications apparatus such as is affixed to a cellular communications tower. In an embodiment, a computing system 500 includes, but is not limited to, a desktop computer. In an embodiment, a system 500 includes, but is not limited to a laptop computer. In an embodiment, a system 500 includes, but is not limited to a tablet. In an embodiment, a system 500 includes, but is not limited to a notebook computer. In an embodiment, a system 500 includes, but is not limited to a personal digital assistant (PDA). In an embodiment, a system 500 includes, but is not limited to a server. In an embodiment, a system 500 includes, but is not limited to a workstation. In an embodiment, a system 500 includes, but is not limited to a cellular telephone. In an embodiment, a system 500 includes, but is not limited to a mobile computing device. In an embodiment, a system 500 includes, but is not limited to a smart phone. In an embodiment, a system 500 includes, but is not limited to an internet appliance. Other types of computing devices may be configured with the microelectronic device that includes TSV pillar and electrical bump in backside recess embodiments.

In an embodiment, the processor 510 has one or more processing cores 512 and 512N, where 512N represents the Nth processor core inside processor 510 where N is a positive integer. In an embodiment, the electronic device system 500 using a F2F, TSV, chip package, multi-die apparatus embodiment that includes multiple processors including 510 and 505, where the processor 505 has logic similar or identical to the logic of the processor 510. In an embodiment, the processing core 512 includes, but is not limited to, pre-fetch logic to fetch instructions, decode logic to decode the instructions, execution logic to execute instructions and the like. In an embodiment, the processor 510 has a cache memory 516 to cache at least one of instructions and data for the multi-layer solder resist on a semiconductor device package substrate in the system 500. The cache memory 516 may be organized into a hierarchal structure including one or more levels of cache memory.

In an embodiment, the processor 510 includes a memory controller 514, which is operable to perform functions that enable the processor 510 to access and communicate with memory 530 that includes at least one of a volatile memory 532 and a non-volatile memory 534. In an embodiment, the processor 510 is coupled with memory 530 and chipset 520. In an embodiment, the chipset 520 is part of a F2F, TSV, chip package, multi-die apparatus embodiment depicted in any of FIGS. 1-3. The processor 510 may also be coupled to a wireless antenna 578 to communicate with any device configured to at least one of transmit and receive wireless signals. In an embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 532 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. The non-volatile memory 534 includes, but is not limited to, flash memory, phase change memory (PCM), read-only memory (ROM), electrically erasable programmable read-only memory (EEPROM), cross-point memory or any other type of non-volatile memory device.

The memory 530 stores information and instructions to be executed by the processor 510. In an embodiment, the memory 530 may also store temporary variables or other intermediate information while the processor 510 is executing instructions. In the illustrated embodiment, the chipset 520 connects with processor 510 via Point-to-Point (PtP or P-P) interfaces 517 and 522. Either of these PtP embodiments may be achieved using a F2F, TSV, chip package, multi-die apparatus embodiment as set forth in this disclosure. The chipset 520 enables the processor 510 to connect to other elements in a F2F, TSV, chip package, multi-die apparatus recess embodiment in a system 500. In an embodiment, interfaces 517 and 522 operate in accordance with a PtP communication protocol such as the Intel® QuickPath Interconnect (QPI) or the like. In other embodiments, a different interconnect may be used.

In an embodiment, the chipset 520 is operable to communicate with the processor 510, 505N, the display device 540, and other devices 572, 576, 574, 560, 562, 564, 566, 577, etc. The chipset 520 may also be coupled to a wireless antenna 578 to communicate with any device configured to at least do one of transmit and receive wireless signals.

The chipset 520 connects to the display device 540 via the interface 526. The display 540 may be, for example, a liquid crystal display (LCD), a plasma display, cathode ray tube (CRT) display, or any other form of visual display device. In an embodiment, the processor 510 and the chipset 520 are merged into a F2F, TSV, chip package, multi-die apparatus embodiment in a system. Additionally, the chipset 520 connects to one or more buses 550 and 555 that interconnect various elements 574, 560, 562, 564, and 566. Buses 550 and 555 may be interconnected together via a bus bridge 572 such as at least one F2F, TSV, chip package, multi-die apparatus embodiment. In an embodiment, the chipset 520, via interface 524, couples with a non-volatile memory 560, a mass storage device(s) 562, a keyboard/mouse 564, a network interface 566, smart TV 576, and the consumer electronics 577, etc.

In an embodiment, the mass storage device 562 includes, but is not limited to, a solid-state drive, a hard disk drive, a universal serial bus flash memory drive, or any other form of computer data storage medium. In one embodiment, the network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the F2F, TSV, chip package, multi-die apparatus embodiments in a computing system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into the processor core 512.

To illustrate the F2F, TSV, chip package, multi-die apparatus embodiments and methods disclosed herein, a non-limiting list of examples is provided herein:

Example 1 is a semiconductor apparatus, comprising: a first semiconductive device including an active surface and a backside surface; a through-silicon via (TSV) that communicates from the active surface to the backside surface; first and second electrical bumps coupled to the active surface; subsequent and second semiconductive devices in respective contact with the first and second electrical bumps, wherein the first and subsequent semiconductive devices are positioned face-to-face with the first semiconductive device; and a redistribution layer (RDL) that contacts the first semiconductive device backside surface and the TSV.

In Example 2, the subject matter of Example 1 optionally includes wherein the TSV is a first TSV and wherein the first TSV is positioned below the subsequent semiconductive device, further including: a second TSV that communicates from the active surface to the backside surface, wherein the second TSV is positioned below the second semiconductive device.

In Example 3, the subject matter of any one or more of Examples 1-2 optionally include wherein the first semiconductive device exhibits a die shadow, and wherein the RDL is configured substantially within the die shadow.

In Example 4, the subject matter of any one or more of Examples 1-3 optionally include wherein the first semiconductive device exhibits a die shadow, wherein the RDL is configured substantially within the die shadow, and wherein each of the subsequent and second semiconductive devices are configured within the die shadow.

In Example 5, the subject matter of any one or more of Examples 1-4 optionally include wherein the first and second electrical bumps are copper pillars.

In Example 6, the subject matter of any one or more of Examples 1-5 optionally include wherein each of the subsequent and second semiconductive devices include active and backside surfaces, wherein the first and second electrical bumps are copper pillars that contact the first semiconductive device active surface to the respective subsequent and second semiconductive device active surfaces.

In Example 7, the subject matter of any one or more of Examples 1-6 optionally include wherein each of the subsequent and second semiconductive devices include active and backside surfaces, further including a heat sink seated on the respective subsequent and second semiconductive device backside surfaces.

In Example 8, the subject matter of any one or more of Examples 1-7 optionally include a molding compound that contacts the respective first and second electrical bumps.

In Example 9, the subject matter of any one or more of Examples 1-8 optionally include wherein the subsequent and second semiconductive devices are configured within a die shadow of the first semiconductive device, and wherein the RDL is configured within the die shadow.

In Example 10, the subject matter of any one or more of Examples 1-9 optionally include a molding compound that contacts the respective first and second electrical bumps, wherein the first and second electrical bumps are copper pillars; wherein the TSV is a first TSV and wherein the first TSV is positioned below the subsequent semiconductive device; a second TSV that communicates from the active surface to the backside surface, wherein the second TSV is positioned below the second semiconductive device; wherein the first semiconductive device exhibits a die shadow, wherein the RDL is configured substantially within the die shadow, and wherein each of the subsequent and second semiconductive devices are configured within the die shadow; a heat sink seated on the respective subsequent and second semiconductive device backside surfaces.

In Example 11, the subject matter of any one or more of Examples 1-10 optionally include wherein the TSV is one of a plurality of TSVs, and wherein the plurality of TSVs are asymmetrically configured within the first semiconductive device.

In Example 12, the subject matter of any one or more of Examples 1-11 optionally include a third semiconductive device face-to-face coupled to the first semiconductive device.

In Example 13, the subject matter of any one or more of Examples 1-12 optionally include a third semiconductive device face-to-face coupled to the first semiconductive device; wherein the TSV is a first TSV and wherein the first TSV is positioned below the subsequent semiconductive device; a second TSV that communicates from the active surface to the backside surface, wherein the second TSV is positioned below the second semiconductive device; a third TSV that communicates from the active surface to the backside surface, wherein the third TSV is positioned below the third semiconductive device; and wherein the first semiconductive device exhibits a die shadow, and wherein the RDL is configured substantially within the die shadow.

In Example 14, the subject matter of any one or more of Examples 1-13 optionally include a third semiconductive device face-to-face coupled to the first semiconductive device; wherein the TSV is a first TSV and wherein the first TSV is positioned below the subsequent semiconductive device; a second TSV that communicates from the active surface to the backside surface, wherein the second TSV is positioned below the second semiconductive device; a third TSV that communicates from the active surface to the backside surface, wherein the third TSV is positioned below the third semiconductive device; wherein the first semiconductive device exhibits a die shadow, and wherein the RDL is configured substantially within the die shadow; and wherein the subsequent, second and third semiconductive devices are substantially within the die shadow.

Example 15 is a process of assembling a semiconductor apparatus, comprising: forming first second electrical bumps on a metallization of a first semiconductive device, wherein the first semiconductive device includes an active surface and a backside surface, and wherein the metallization is part of the active surface; forming a redistribution layer on the first semiconductive device backside surface, wherein the first semiconductive device includes a through-silicon via (TSV) that communicates from the backside surface to the metallization; assembling a subsequent semiconductive device and a second semiconductive device to the respective first and second electrical bumps, wherein the first and subsequent semiconductive devices are assembled face-to-face to the first semiconductive device; and wherein the first semiconductive device forms a footprint that shadows the subsequent semiconductive device, the second semiconductive device and the redistribution layer.

In Example 16, the subject matter of Example 15 optionally includes contacting first and second electrical bumps with a molding compound that also contacts the first, subsequent and second semiconductive devices; and planarizing the molding compound at the subsequent and second semiconductive device backside surfaces.

In Example 17, the subject matter of any one or more of Examples 15-16 optionally include contacting the first and second electrical bumps with a molding compound that also contacts the first, subsequent and second semiconductive devices; planarizing the molding compound at the subsequent and second semiconductive device backside surfaces; and seating a heat sink at the subsequent and second semiconductive device backside surfaces.

In Example 18, the subject matter of any one or more of Examples 15-17 optionally include wherein the first semiconductive device is part of a semiconductive wafer including a plurality of semiconductive devices, further including after assembling the second semiconductive device: contacting the first and second electrical bumps with a molding compound that also contacts the first, subsequent and second semiconductive devices; planarizing the molding compound at the subsequent and second semiconductive device backside surfaces; and singulating the first semiconductive device from the semiconductive wafer to achieve a chip-scale package with the subsequent and second semiconductive devices and the redistribution layer.

In Example 19, the subject matter of any one or more of Examples 15-18 optionally include wherein the first semiconductive device is part of a semiconductive wafer including a plurality of semiconductive devices, further including after assembling the second semiconductive device: contacting the first and second electrical bumps with a molding compound that also contacts the first, subsequent and second semiconductive devices; planarizing the molding compound at the subsequent and second semiconductive device backside surfaces; and singulating the first semiconductive device from the semiconductive wafer to achieve a chip-scale package with the subsequent and second semiconductive devices and the redistribution layer; and seating a heat sink at the subsequent and second semiconductive device backside surfaces.

Example 20 is a computing system, comprising: a first semiconductive device including an active surface and a backside surface; a through-silicon via (TSV) that communicates from the active surface to the backside surface; first and second electrical bumps coupled to the active surface; subsequent and second semiconductive devices in respective contact with the first and second electrical bumps, wherein the first and subsequent semiconductive devices are positioned face-to-face with the first semiconductive device; a redistribution layer (RDL) that contacts the first semiconductive device backside surface and the TSV; a molding compound that contacts the respective first and second electrical bumps, wherein the first and second electrical bumps are copper pillars; wherein the TSV is a first TSV and wherein the first TSV is positioned below the subsequent semiconductive device; a second TSV that communicates from the active surface to the backside surface, wherein the second TSV is positioned below the second semiconductive device; wherein the first semiconductive device exhibits a die shadow, wherein the RDL is configured substantially within the die shadow, and wherein each of the subsequent and second semiconductive devices are configured within the die shadow; and wherein the semiconductor apparatus is part of a chipset.

In Example 21, the subject matter of Example 20 optionally includes a heat sink seated on the respective subsequent and second semiconductive device backside surfaces; and a ball-grid array contacting the RDL, RDL is coupled to a board, and wherein the board includes a shell that provides electrical insulation for the first semiconductive device.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

With semiconductive devices, an "active surface" includes active semiconductive devices and may include metallization that connects to the active semiconductive devices. A "backside surface" is the surface opposite the active surface.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A process of assembling a semiconductor apparatus, comprising:

forming first and second electrical bumps on a metallization of a first semiconductive device, wherein the first semiconductive device includes an active surface and a backside surface, and wherein the metallization is part of the active surface;

forming a redistribution layer on the first semiconductive device backside surface, wherein the first semiconductive device includes a through-silicon via (TSV) that communicates from the backside surface to the metallization, the redistribution layer having a via in direct physical contact with the TSV, the redistribution layer having a trace that contacts the via, the trace in a trace level, and the redistribution layer having a plurality of bond pads below the trace level;

assembling a subsequent semiconductive device and a second semiconductive device to first and second electrical bumps on the active surface, wherein the second and subsequent semiconductive devices are assembled face-to-face to the first semiconductive device; and wherein the first semiconductive device forms a footprint that shadows the subsequent semiconductive device, the second semiconductive device and the redistribution layer.

2. The process of claim 1, further including:
contacting the first and second electrical bumps with a molding compound that also contacts the first, subsequent and second semiconductive devices; and
planarizing the molding compound at the subsequent and second semiconductive device backside surfaces.

3. The process of claim 1, further including:
contacting the first and second electrical bumps with a molding compound that also contacts the first, subsequent and second semiconductive devices;
planarizing the molding compound at the subsequent and second semiconductive device backside surfaces; and
seating a heat sink at the subsequent and second semiconductive device backside surfaces.

4. The process of claim 1, wherein the first semiconductive device is part of a semiconductive wafer including a plurality of semiconductive devices, further including after assembling the second semiconductive device:
contacting the first and second electrical bumps with a molding compound that also contacts the first, subsequent and second semiconductive devices; planarizing the molding compound at the subsequent and second semiconductive device backside surfaces; and
singulating the first semiconductive device from the semiconductive wafer to achieve a package with the subsequent and second semiconductive devices and the redistribution layer.

5. The process of claim 1, wherein the first semiconductive device is part of a semiconductive wafer including a plurality of semiconductive devices, further including after assembling the second semiconductive device:
contacting the first and second electrical bumps with a molding compound that also contacts the first, subsequent and second semiconductive devices;
planarizing the molding compound at the subsequent and second semiconductive device backside surfaces; and
singulating the first semiconductive device from the semiconductive wafer to achieve a package with the subsequent and second semiconductive devices and the redistribution layer; and
seating a heat sink at the subsequent and second semiconductive device backside surfaces.

6. A method, comprising:
forming first and second electrical bumps on a metallization of a first semiconductive device, wherein the first semiconductive device includes an active surface and a backside surface, and wherein the metallization is formed on the active surface;
forming a redistribution layer in direct contact with the first semiconductive device backside surface, wherein the first semiconductive device includes a through-silicon via (TSV) that communicates from the backside surface to the metallization, the redistribution layer having a via in direct physical contact with the TSV, the redistribution layer having a trace that contacts the via, the trace in a trace level, and the redistribution layer having a plurality of bond pads below the trace level; and
assembling a processor die and a second die to the respective first and second electrical bumps face-to-face with the first semiconductive device.

7. The method of claim 6, wherein assembling a processor die and a second die includes assembling such that the first semiconductive device forms a footprint that shadows the processor die and the second die.

8. The method of claim 6, wherein assembling a processor die and a second die includes assembling such that the first semiconductive device forms a footprint that shadows the redistribution layer.

9. The method of claim 6, further including forming the through-silicon via (TSV) in the first semiconductive device with a taper from a wider dimension at the backside surface to a narrower dimension at the active surface.

10. The method of claim 6, wherein forming first and second electrical bumps on a metallization of a first semiconductive device includes forming first and second copper pillars.

11. The method of claim 6, wherein assembling the processor die and the second die includes assembling the processor die and a memory controller hub die.

12. A method, comprising:
forming a plurality of first semiconductor devices at a wafer level, the first semiconductor devices including an active surface, a backside surface and a metallization on the active surface;
forming first and second electrical bumps on the metallization of the first semiconductive devices;
forming a redistribution layer in direct contact with the first semiconductive device backside surface, wherein the first semiconductive device includes a through-silicon via (TSV) that communicates from the backside surface to the metallization, the redistribution layer having a via in direct physical contact with the TSV, the redistribution layer having a trace that contacts the via, the trace in a trace level, and the redistribution layer having a plurality of bond pads below the trace level;
assembling a processor die and a second die to the respective first and second electrical bumps face-to-face with the first semiconductive device; and
singulating the first semiconductor devices into separate devices with a respective processor die and second die.

13. The method of claim 12, further including at least partially encapsulating the processor die and the second die with a molding compound, and planarizing the molding compound at a backside of the processor die and the second die prior to singulating.

14. The method of claim 12, further including attaching a ball grid array to an exposed surface of the redistribution layer prior to singulating.

* * * * *